United States Patent
Kitamura et al.

(10) Patent No.: US 7,768,002 B2
(45) Date of Patent: Aug. 3, 2010

(54) TRANSPARENT ORGANIC THIN FILM TRANSISTOR

(75) Inventors: Tetsu Kitamura, Ashigarakami-gun (JP); Kimiatsu Nomura, Ashigarakami-gun (JP); Masayuki Hayashi, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 12/397,840

(22) Filed: Mar. 4, 2009

(65) Prior Publication Data
US 2009/0224235 A1 Sep. 10, 2009

(30) Foreign Application Priority Data
Mar. 5, 2008 (JP) ............................. 2008-055434

(51) Int. Cl.
*H01L 35/24* (2006.01)
(52) U.S. Cl. ..................... 257/40; 257/49; 257/59; 257/66; 257/72

(58) Field of Classification Search ............ 257/40, 257/49, 59, 66, 72
See application file for complete search history.

(56) References Cited

OTHER PUBLICATIONS

Hiromichi Ohta, et al., "Transparent Organic Thin-Film Transistor with a Laterally Grown Non-Planar Phthalocyanine Channel", Advanced Materials, Feb. 17, 2004, pp. 312-316, vol. 16, No. 4.
Qing Cao, et al., "Transparent flexible organic thin-film transistors that use printed single-walled carbon nanotube electrodes", Applied Physics Letters, Mar. 15, 2006, pp. 113511-1-113511-3, vol. 88, No. 113511.

*Primary Examiner*—Long Pham
(74) *Attorney, Agent, or Firm*—Sughrue Mion, PLLC (57) ABSTRACT

A transparent organic thin film transistor, which contains a p-type organic semiconductor material employed in a semiconductor active layer of the transparent organic thin film transistor, wherein the p-type organic semiconductor material has a maximum absorbance of 0.2 or less in a visible range of 400 to 700 nm, in which the maximum absorbance is determined in the case where the thin film is made to have a film thickness of 30 nm.

14 Claims, 3 Drawing Sheets

TRANSPARENT ORGANIC THIN FILM TRANSISTOR

FIELD OF THE INVENTION

The present invention relates to a transparent organic thin film transistor prepared by employing a substantially transparent and colorless p-type organic semiconductor material.

BACKGROUND OF THE INVENTION

There exist demands for electronic devices flexible, lightweight, favorable in appearance and convenient in use in daily life without particular recognition of its presence that are aimed at use in ubiquitous information society where information is available anytime anywhere. However, silicon which is a typical conventional semiconductor material, cannot satisfy these demands sufficiently. Recently, organic semiconductor materials are attracting attention as materials satisfying such demands. In particular, organic semiconductor materials allowing film forming by wet process such as solution coating method have a possibility of production of large-area elements at lower temperature and lower cost (see, for example, Advanced Materials, 2004, vol. 16, p. 312-316, and Applied Physics Letters, 2006, vol. 88. p. 113511). Electronic devices having these properties that are also transparent and colorless, if produced, would be useful in establishing such a ubiquitous information society.

In image-displaying devices such as liquid crystal display and organic EL display and also in light-receiving devices such as optical sensor, if an opaque semiconductive circuit for example of conventional silicon is used as a selective driving circuit, the selective driving circuit and the an apertural area should be formed separately on different portions, leading to decrease numerical aperture. It would be possible to raise the numerical aperture significantly if a transparent and colorless thin film transistor (TFT) can be used as the selective driving circuit, because the transistor can be laminated with an image-displaying element or a light-receiving element. However, there is currently no such thin film transistor satisfying the requirements both in transparency and transistor characteristics at the same time.

For use as the selective driving circuit, the TFT may be a p-type transistor or n-type transistor. Among these, p-type organic semiconductor materials are often superior in properties, and generally the properties of p-type organic TFT are better, because its operation stability in air is higher.

Examples of the transparent organic thin film transistors containing the p-type organic semiconductor material in an active layer include those using pentacene (see, for example, Advanced Materials, 2004, vol. 16, p. 312-316) and those using vanadyl phthalocyanine (VOPc) (see, for example, Applied Physics Letters, 2006, vol. 88, p. 113511). Although these materials have light absorption in the visible range, they are used as substantially transparent thin film transistors, as the absorbance thereof was made smaller as they are used as a thin film. Although these organic thin film transistors are relatively transparent, there still exists continuing need for improvement in transparency and colorlessness.

SUMMARY OF THE INVENTION

The present invention resides in a transparent organic thin film transistor, which comprises a p-type organic semiconductor material employed in a semiconductor active layer of the transparent organic thin film transistor, wherein the p-type organic semiconductor material has a maximum absorbance of 0.2 or less in a visible range of 400 to 700 mm, in which the maximum absorbance is determined in the case where the thin film is made to have a film thickness of 30 nm.

Further, the present invention resides in a transparent semiconductor circuit, comprising the transparent organic thin film transistor.

Further, the present invention resides in an image-displaying device, which is driven by a selective driving circuit comprising the transparent organic thin film transistor.

Furthermore, the present invention resides in a light receiving device which is driven by a selective driving circuit comprising the transparent organic thin film transistor.

Other and further features and advantages of the invention will appear more fully from the following description, appropriately referring to the accompanying drawings.

DETAILED DESCRIPTION OF THE INVENTION

According to the present invention, there is provided the following means:

(1) A transparent organic thin film transistor, which comprises a p-type organic semiconductor material employed in a semiconductor active layer of the transparent organic thin film transistor, wherein the p-type organic semiconductor material has a maximum absorbance of 0.2 or less in a visible range of 400 to 700 mm, in which the maximum absorbance is determined in the case where the thin film is made to have a film thickness of 30 nm.

(2) The transparent organic thin film transistor according to the above item (1), wherein carrier mobility thereof is $1.0 \times 10^{-5}$ cm$^2$/Vs or more.

(3) The transparent organic thin film transistor according to the above item (1) or (2), wherein the p-type organic semiconductor material is a low molecular compound.

(4) The transparent organic thin film transistor according to any one of the above items (1) to (3), wherein the semiconductor active layer is formed by a solution coating method.

(5) The transparent organic thin film transistor according to any one of the above items (1) to (4), wherein absorption maximum wavelength of the p-type organic semiconductor material in the thin film state is 700 nm or more.

(6) The transparent organic thin film transistor according to any one of the above items (1) to (5), wherein the p-type organic semiconductor material is a phthalocyanine compound represented by Formula (Pc-1):

Formula (Pc-1)

wherein, M represents a central metal atom; $R^1$ to $R^{16}$ each independently represents a hydrogen atom or a substituent; R represents a substituent; and n represents 1 or 2.

(7) The transparent organic thin film transistor according to any one of the above items (1) to (5), wherein the p-type organic semiconductor material is a naphthalocyanine compound represented by Formula (Nc-1):

Formula (Nc-1)

wherein, M represents a metal atom, or hydrogen atoms bound to the $N^1$ and $N^2$; $N^1$ and $N^2$ each independently represent a nitrogen atom; and $R^{17}$ to $R^{40}$ each independently represents a hydrogen atom or a substituent.

(8) The transparent organic thin film transistor according to any one of the above items (1) to (5), wherein the p-type organic semiconductor material is a naphthalocyanine compound represented by Formula (Nc-2):

Formula (Nc-2)

wherein, M represents a central metal atom; $R^{17}$ to $R^{40}$ each independently represents a hydrogen atom or a substituent; R represents a substituent; and n represents 1 or 2.

(9) A transparent semiconductor circuit, comprising the transparent organic thin film transistor according to any one of the above items (1) to (8).

(10) An image-displaying device, which is driven by a selective driving circuit comprising the transparent organic thin film transistor according to any one of the above items (1) to (8).

(11) A light receiving device, which is driven by a selective driving circuit comprising the transparent organic thin film transistor according to any one of the above items (1) to (8).

The present invention is explained in detail below.

Figure 1:
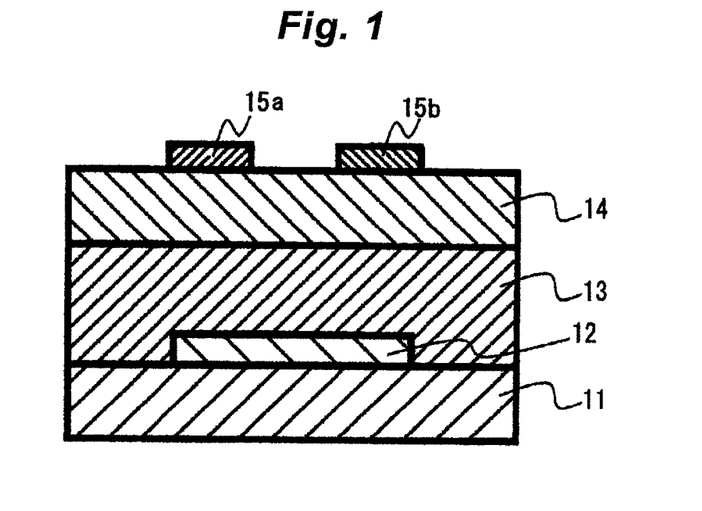
FIG. 1 is a schematic cross-sectional view illustrating a structure of a transparent organic thin film transistor according to the present invention.

FIG. 1 is a sectional view of schematically illustrating one embodiment of the transparent organic thin film transistor (transparent organic TFT) of the present invention. The transparent organic thin film transistor of the present invention may have any structure and is not particularly limited, but the field-effect transistor (FET) shown in FIG. 1 is most preferable. The transistor shown in FIG. 1 has a laminate structure as a basic structure. As an undermost layer, there is arranged a transparent substrate 11. A transparent gate electrode 12 is arranged at a portion of the upper surface of the substrate and is covered. Further, a transparent insulator layer 13 is prepared so as to cover said electrode therewith and also to contact with the transparent substrate 11 at the other portion than the electrode 12. Furthermore; a semiconductor active layer 14 is prepared on an upper surface of the transparent insulator layer 13, and moreover, at a portion of the upper surface of the semiconductor active layer, there are arranged a transparent source electrode 15*a* and a transparent drain electrode 15*b* isolating from each other. The structure shown in FIG. 1 is called as a top contact type device. Besides, preferably used are bottom contact type device in which the two electrodes 15*a* and 15*b* are arranged at the bottom portion of the semiconductor active layer. Moreover, the transistor may have a vertical transistor structure, in which carrier moves in the film thickness direction of the organic semiconductor film.

(Semiconductor Active Layer)

The transparent organic thin film transistor according to the present invention is prepared by employing, as its semiconductor active layer 14, a p-type organic semiconductor material having a maximum absorbance, as determined as a thin film having a film thickness of 30 nm, of 0.2 or less in a visible range of 400 to 700 nm. The p-type organic semiconductor material is substantially transparent and colorless. The film thickness of the organic semiconductor thin film can be determined, for example, by using a stylus profilometer. The film thickness may be determined by measuring absorption spectra of multiple thin films different in film thickness and calculating the maximum absorbance per 30-nm film thickness, based on the obtained calibration curve. It is possible to obtain an organic TFT superior in transparency and colorlessness by selecting a p-type organic semiconductor material having such absorption properties.

The term "organic semiconductor material" in the present invention means an organic material exhibiting semiconductor characteristics. Similar to a material of an inorganic semiconductor, there are p-type organic semiconductor conducting positive holes as a carrier (hereinafter, also simply referred to as "p-type material" or "positive hole-transporting material") and n-type organic semiconductor conducting electrons as a carrier (hereinafter, also simply referred to as "n-type material" or "electron-transporting material"). Generally among organic semiconductor materials, more p-type materials show favorable properties, and p-type transistors are better in transistor operational stability under atmospheric environment. For these reasons, a p-type organic semiconductor material is used in the present invention.

The flowability of the carrier in the organic semiconductor layer is expressed as carrier mobility (also simply referred to as "mobility") μ, as a characteristic of the organic thin film transistor. Mobility is preferably higher, more preferably $1.0 \times 10^{-7}$ cm$^2$/Vs or higher, further preferably $1.0 \times 10^{-6}$ cm$^2$Vs or higher, and most preferably $1.0 \times 10^{-5}$ cm$^2$/Vs or higher, depending on the use of the transistor. Mobility can be determined by characteristics of the field-effect transistor (FET) device, or by the time of flight type (TOF) method.

The p-type organic semiconductor material may be any material, if it has a maximum absorbance, as determined as a thin film having a film thickness of 30 nm, of 0.2 or less (preferably 0.17 or less, more preferably 0.15 or less) in a visible range of 400 to 700 nm, and may be a low-molecular-weight or polymeric material, but is preferably a low-molecular weight material. Many low-molecular weight materials have favorable properties, because they are easily purified by application of various purification methods such as sublimation, recrystallization and column chromatography and have a highly ordered crystal structure due to their fixed molecular structure. The molecular weight of the low-molecular weight material is preferably 100 or more and 5000 or less, more preferably 150 or more and 3000 or less, and still more preferably 200 or more and 2000 or less.

As a method of forming a semiconductor thin film containing an organic semiconductor material, there can be used any of a dry film forming process and a wet film forming process. Specific examples of the dry film forming process include a physical vapor phase growth method such as a vacuum evaporation method, a spattering method, an ion plating method and a molecular beam epitaxy (MBE) method, and a chemical vapor deposition (CVD) method such as a plasma polymerization. Among these, the vacuum evaporation method is preferable. As the wet film forming process (solution coating method), there is a method of dissolving an organic compound in a solvent capable of dissolving the organic compound or dispersing the compound homogeneously, and making the resultant solution or dispersion a thin coating to form a film. As specific examples, there can be used ordinary methods such as a cast process, a blade coating process, a wire bar coating process, a splay coating process, a dip (an immersion) coating process, a bead coating process, an air knife coating process, a curtain coating process, an ink jet coating process, a spin coating process, and a Langmuir-Blodgett (LB) process. Preferably there can be used a cast process, a spin coating process and an ink jet coating process. Both dry film forming process and wet film forming process are preferable, but wet film forming process (solution coating method) is more preferable, as it allows preparation of a larger area element at low temperature and also at low cost.

In the case where an organic semiconductor film may be formed through a solution coating method, an organic semiconductor material or both said material and a binder resin are dissolved or dispersed in a proper organic solvent and/or water to prepare a coating liquid. A thin film can be formed using the thus-obtained coating liquid through various coating methods. A concentration of the organic semiconductor material for use in the present invention in the coating liquid is preferably in the range of from 0.1 to 80% by mass, more preferably in the range of from 0.1 to 30% by mass, and further preferably in the range of from 0.1 to 10% by mass. Control of the concentration to such the range enables to form a film having arbitrary thickness.

The organic solvent include, e.g., hydrocarbon solvents such as hexane, octane, decane, toluene, xylene, ethyl benzene, 1-methyl naphthalene and 1,2-dicyclobenzene; ketone solvents such as acetone, methyl ethyl ketone, methyl isobutyl ketone and cyclohexanone; halogenated hydrocarbon solvents such as dichloromethane, chloroform, tetrachloromethane, dichloroethane, trichloroethane, tetrachloroethane, chlorobenzene, dichlorobenzene, and chlorotoluene; ester solvents such as ethyl acetate, butyl acetate, and amyl acetate; alcohol solvents such as methanol, propanol, butanol, pentanol, hexanol, cyclohexanol, methylcellosolve, ethylcellosolve, and ethylene glycol; ether solvents such as dibutylether, tetrahydrofuran, dioxane, and anisole; and polar solvents such as N,N-dimethylformamide, N,N-dimethylacetamide, 1-methyl-2-pyrrolidone, 1-methyl-2-imidazolidinone and dimethylsulfoxide.

In the case where a resin binder is used in the present invention, examples of the resin binder include insulating polymers such as polystylene, polycarbonate, polyarylate, polyester, polyamide, polyimide, polyurethane, polysiloxane, polysulfone, polymethylmethacrylate, polymethylacrylate, cellulose, polyethylene and polypropylene; and copolymers of these polymers; photoconductive polymers such as polyvinylcarbazol and polysilane, and electrically conductive polymers such as polythiophen, polypyrrole, polyaniline, and polypara phenylenevinilene. The resin binder may be used solely or, alternatively two or more kinds of the resin binder may be used in combination. Taking a mechanical strength of the thin film into consideration, preferred are resin binders having a high glass transition temperature. Whereas, taking a charge transfer degree into consideration, preferred are resin binders containing no polar group, photoconductive polymers and electrically conductive polymers. It is preferable in characteristics of the organic semiconductor not to use such the resin binder. But, the resin binder is sometimes used according to the purpose. In this case, an amount of the resin binder used is not particularly limited, but preferably the binder is used in the range of from 0.1 to 90% by mass, more preferably in the range of from 0.1 to 50% by mass, and further preferably in the range of from 0.1 to 30% by mass, based on the organic semiconductor thin film layer.

The thickness of the semiconductor active layer is not particularly limited, but preferably smaller for improvement in transparency and colorlessness, and specifically, it is preferably 1 nm to 100 nm, more preferably 1 nm to 70 nm, and particularly preferably 1 nm to 50 nm.

The substrate surface may be subjected to a treatment for controlling the smoothness/irregularity, hydrophilicity/hydrophobicity, intermolecular interaction and others and also the morphology and the molecular orientation state of the film. Examples of the surface-treating methods include a method of surface-treating the surface of silicon dioxide by coating with hexamethyldisilazane (HMDS) or octadecyltrichlorosilane (OTS), a method of surface-treating the surface of gold with an alkanethiol, and the like.

The substrate may be heated or cooled during filming, and it is possible to control the film morphology and molecular orientation state by changing the substrate temperature. The substrate temperature is not particularly limited, but preferably in the range of 0° C. to 200° C.

The p-type organic semiconductor material for use in the present invention has a maximum absorbance, as determined as a thin film having a film thickness of 30 nm, of 0.2 or less in a visible range of 400 to 700 nm, and is thus substantially transparent and colorless. Accordingly, the absorption maximum wavelength of the p-type organic semiconductor material for use in the present invention in the thin film state is preferably in an ultraviolet range (shorter than 400 nm) or in an infrared range (longer than 700 nm). Generally, the semiconductor properties are more favorable when a wider π-conjugation system is contained, and thus, a material having the absorption maximum wavelength, as determined in the thin film state, in the infrared range is used favorably. The absorption maximum wavelength in the thin film state is preferably longer than 700 nm, more preferably 750 nm or more, and still more preferably 800 nm or more.

The p-type organic semiconductor for use in the present invention is preferably a phthalocyanine compound represented by Formula (Pc-1).

Formula (Pc-1)

In formula (Pc-1), M represents a central metal atom; $R^1$ to $R^{16}$ each independently represents a hydrogen atom or a substituent; R represents a substituent; and n represents 1 or 2.

In Formula (Pc-1), the central metal M is not particularly limited, as long as it is a metal atom (also referred to as a semimetal atom) that can bind to one or two substituent(s) R (also called axial ligand). M is preferably Si, Ge, Sn, Al, Ga or In, more preferably Si, Ge or Sn. Introduction of axial ligand(s) R to the central metal M leads to effective reduction of π-π interaction, thus preventing broadening of the thin film's absorption spectrum (leading to deterioration in transparency and colorlessness). In addition, because J association, which leads to elongation of the absorption maximum wavelength, is involved predominantly, a thin film superior in transparency and colorlessness is obtained. It is also advantageous in that it leads to improvement in solubility and sublimation-evaporation efficiency, thus facilitating purification and filming.

The substituent R introduced as the axial ligand is not particularly limited, and can be selected from the substituents W described later. Among these substituents W, an alkyl group, an aryl group, an alkoxy group, an aryloxy group, a heterocyclic oxy group, an alkylthio group, an arylthio group, a heterocyclic thio group, a hydroxyl group, a mercapto group, a halogen atom, a heterocyclic group, a silyl group, and a silyloxy group are preferable; an alkyl group, a cycloalkyl group, an aryl group, an alkoxy group, an aryloxy group, a heterocyclic oxy group, a halogen atom, a heterocyclic group, and a silyloxy group are more preferable; and an alkoxy group, an aryloxy group, a heterocyclic oxy group, and a silyloxy group are further preferable. These groups may be further substituted with other substituents (for example, those substituents set forth in W). In the case of plural Rs, they may be the same or different from each other, but the case of the same groups is preferable.

$R^1$ to $R^{16}$ each independently represents a hydrogen atom or a substituent. Examples of the substituents include the substituents W described later. Among these substituents W, a hydrogen atom, an alkyl group, an aryl group, an alkoxy group, an aryloxy group, a heterocyclic oxy group, an alkylthio group, an arylthio group, a heterocyclic thio group, a hydroxyl group, a mercapto group, a halogen atom, a heterocyclic group, and a silyl group are preferable; a hydrogen atom, an alkyl group, an aryl group, an alkoxy group, an aryloxy group, a heterocyclic oxy group, a halogen atom, a heterocyclic group, and a silyl group are more preferable; and a hydrogen atom, an alkyl group, an aryl group, an alkoxy group, an aryloxy group, and a silyl group are further preferable. These groups may be further substituted with other substituents (for example, those substituents set forth in W). In addition, neighboring substituents (preferably, $R^2$ and $R^3$, $R^6$ and $R^7$, $R^{10}$ and $R^{11}$, or $R^{14}$ and $R^{15}$) may preferably bind to each other, forming a benzo-fused ring. The fused benzene ring may have another substituent substituted therewith.

The p-type organic semiconductor material for use in the present invention is also preferably a naphthalocyanine compound represented by Formula (Nc-1). Such a naphthalocyanine compound, which has a wider π-conjugate system and thus, has an elongated absorption maximum wavelength and shows smaller absorption in the visible range, is more preferable, because it is improved in transparency and colorlessness.

Formula (Nc-1)

In formula (Nc-1), M represents a metal atom or hydrogen atoms bound to the $N^1$ and $N^2$; $N^1$ and $N^2$ each independently represent a nitrogen atom; and $R^{17}$ to $R^{40}$ each independently represents a hydrogen atom or a substituent.

In Formula (Nc-1), M represents a metal atom (including a semimetal atom) or two hydrogen atoms bound to the nitrogen atoms represented by $N^1$ and $N^2$. In the case that M represents a metal atom, it may be any metal as long as it forms a stable complex. M is preferably hydrogen atoms, Li, Na, K, Mg, Ca, Ti, Zr, V, Mn, Fe, Ru, Co, Ni, Pd, Pt, Cu, Ag, Au, Zn, Cd, Hg, Al, Ga, In, Si, Ge, Sn, Pb, or Sb; more preferably hydrogen atoms, Ti, V, Mn, Fe, Co, Ni, Cu, Zn, Al, Ga, In, Si, Ge, Sn, or Pb; and further preferably Al, Ga, In, Si, Ge, or Sn.

When M represents a metal atom, the metal atom may be bound to an axial ligand R, and R can be selected from the substituents W described later. The axial ligand R is the same as the axial ligand R in Formula (Pc-1) above and the favorable examples thereof are also the same.

When M in Formula (Nc-1) above represents hydrogen atoms, the compound can be represented by Formula (Nc-1').

Formula (Nc-1')

In formula (Nc-1'), $R^{17}$ to $R^{40}$ each independently represents a hydrogen atom or a substituent.

In formulae (Nc-1) and (Nc-1'), $R^{17}$ to $R^{40}$ each independently represents a hydrogen atom or a substituent. Examples of the substituents include the substituents W described later. Among these substituents W, a hydrogen atom, an alkyl group, an aryl group, an alkoxy group, an aryloxy group, a heterocyclic oxy group, an alkylthio group, an arylthio group, a heterocyclic thio group, a hydroxyl group, a mercapto group, a halogen atom, a heterocyclic group, and a silyl group are preferable; a hydrogen atom, an alkyl group, an aryl group, an alkoxy group, an aryloxy group, a heterocyclic oxy group, a halogen atom, a heterocyclic group, and a silyl group are more preferable; and a hydrogen atom, an alkyl group, an aryl group, an alkoxy group, an aryloxy group, and a silyl group are further preferable. These groups may be further substituted with other substituents (for example, those substituents set forth in W). Anthracyanine compounds formed by benzo-ring fusion of neighboring substituents (particularly preferably, $R^{19}$ and $R^{20}$, $R^{25}$ and $R^{26}$, $R^{31}$ and $R^{32}$, or $R^{37}$ and $R^{38}$) also have an elongated absorption maximum wavelength and thus are preferable for improvement in transparency and colorless.

When the central metal M has an axial ligand R, the π-π interaction can be effectively reduced, thus preventing broadening of the thin film's absorption spectrum (leading to deterioration in transparency and colorlessness). In addition, because J association, which leads to elongation of the absorption maximum wavelength, is involved predominantly, a thin film superior in transparency and colorlessness is obtained. It is also advantageous in that it leads to improvement in solubility and sublimation-evaporation efficiency. Thus, all of the groups $R^{17}$ to $R^{40}$ may not be substituent additionally introduced, and the number of substituents having an introduced substituent among $R^{17}$ to $R^{40}$ is preferably 8 or less, more preferably 4 or less, and most preferably 0 (that is, $R^{17}$ to $R^{40}$ each are a hydrogen atom), from the viewpoint of semiconductor properties.

When the central metal M have no axial ligand, it is preferable to introduce a substituent to $R^{17}$ to $R^{40}$ for prevention of broadening of the absorption spectrum (leading to deterioration in transparency and colorlessness) and improvement in solubility and sublimation-vaporization efficiency. Among $R^{17}$ to $R^{40}$, the number of substituents having an introduced substituent is preferably 0 to 16, more preferably 4 to 16.

The p-type organic semiconductor material represented by Formula (Pc-1) or Formula (Nc-1) is preferably a compound represented by Formula (Nc-2).

Formula (Nc-2)

In formula (Nc-2), M represents a central metal atom; $R^{17}$ to $R^{40}$ each independently represents a hydrogen atom or a substituent; R represents a substituent; and n represents 1 or 2.

In Formula (Nc-2), the central metal M is not particularly limited, as long as it is a metal atom (including a semimetal atom) that can bind to one or two axial ligands R. M is preferably Si, Ge, Sn, Al, Ga or In; more preferably Si, Ge or Sn; and particularly preferably Si.

R is the same as that in Formula (Pc-1) or Formula (Nc-1) and the favorable examples thereof are also the same.

$R^{17}$ to $R^{40}$ are the same as those in Formula (Nc-1) above and the favorable examples thereof are also the same.

In the present invention, when specific sites in the substituent are called "substituents", the sites itself may not be substituted or may be substituted by one or more (to a possible maximum number) substituents. For example, "an alkyl group" means a substituted or unsubstituted alkyl group. Namely, the substituents which can be used in the compound for use in the present invention can be further substituted.

When such a substituent is set "W", the substituent represented by W may be any substituent and is not particularly limited, and, examples thereof include a halogen atom, an alkyl group (including, as well as a linear or branched alkyl group, a cycloalkyl group, a bicycloalkyl group, and a tricycloalkyl group), an alkenyl group (including, as well as a linear or branched alkenyl group, a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituents.

Specifically, the substituent represented by W represents the group as shown in the following items (1) to (48).

(1) Halogen atom (e.g., a fluorine atom, a chlorine atom, a bromine atom, an iodine atom)

(2) Alkyl group (which means a linear, branched or cyclic substituted or unsubstituted alkyl group, and examples of the alkyl group include the groups as shown in the following items (2-a) to (2-e))

(2-a) Alkyl group (alkyl group having preferably from 1 to 30 carbon atoms, e.g., methyl, ethyl, n-propyl, isopropyl, tert-butyl, n-octyl, eicosyl, 2-chloroethyl, 2-cyanoethyl, 2-ethylhexyl)

(2-b) Cycloalkyl group (preferably a substituted or unsubstituted cycloalkyl group having from 3 to 30 carbon atoms, e.g., cyclohexyl, cyclopentyl, 4-n-dodecyl-cyclohexyl)

(2-c) Bicycloalkyl group (preferably a substituted or unsubstituted bicycloalkyl group having from 5 to 30 carbon atoms, e.g., bicyclo[1,2,2]heptan-2-yl, bicyclo[2,2,2]octan-3-yl)

(2-d) Tricycloalkyl group (preferably a substituted or unsubstituted tricycloalkyl group having from 7 to 30 carbon atoms, e.g., 1-adamantyl)

(2-e) Alkyl group having a polycyclic structure
The alkyl group in the substituents described below (for example, an alkyl group in an alkylthio group) means an alkyl group having such a concept and further includes an alkenyl group and an alkynyl group.

(3) Alkenyl group (which means a linear, branched or cyclic substituted or unsubstituted alkenyl group, and examples of the alkenyl group include the groups as shown in the following items (3-a) to (3-c))

(3-a) Alkenyl group (preferably a substituted or unsubstituted alkenyl group having from 2 to 30 carbon atoms, e.g., vinyl, allyl, prenyl, geranyl, oreyl)

(3-b) Cycloalkenyl group (preferably a substituted or unsubstituted cycloalkenyl group having from 3 to 30 carbon atoms, e.g., 2-cyclopenten-1-yl, 2-cyclohexen-1-yl)

(3-c) Bicycloalkenyl group (a substituted or unsubstituted bicycloalkenyl group, preferably a substituted or unsubstituted bicycloalkenyl group having from 5 to 30 carbon atoms, e.g., bicyclo[2,2,1]hept-2-en-1-yl, bicyclo[2,2,2]oct-2-en-4-yl)

(4) Alkynyl group (preferably a substituted or unsubstituted alkynyl group having from 2 to 30 carbon atoms, e.g., ethynyl, propargyl, trimethylsilylethynyl)

(5) Aryl group (preferably a substituted or unsubstituted aryl group having from 6 to 30 carbon atoms, e.g., phenyl, p-tolyl, naphthyl, m-chlorophenyl, o-hexadecanoylaminophenyl, ferrocenyl)

(6) Heterocyclic group (preferably a monovalent group resultant from removing one hydrogen atom of a 5- or 6-membered substituted or unsubstituted aromatic or non-aromatic heterocyclic compound, more preferably a 5- or 6-membered aromatic heterocyclic group having from 3 to 50 carbon atoms, e.g., 2-furyl, 2-thienyl, 2-pyrimidinyl, 2-benzothiazolyl; the heterocyclic group may also be a cationic heterocyclic group such as 1-methyl-2-pyridinio and 1-methyl-2-quinolinio)

(7) Cyano group (8) Hydroxyl group (9) Nitro group (10) Carboxyl group (11) Alkoxy group (preferably a substituted or unsubstituted alkoxy group having from 1 to 30 carbon atoms, e.g., methoxy, ethoxy, isopropoxy, tert-butoxy, n-octyloxy, 2-methoxyethoxy)

(12) Aryloxy group (preferably a substituted or unsubstituted aryloxy group having from 6 to 30 carbon atoms, e.g., phenoxy, 2-methylphenoxy, 4-tert-butylphenoxy, 3-nitrophenoxy, 2-tradecanoylaminophenoxy)

(13) Silyloxy group (preferably a silyloxy group having from 3 to 30 carbon atoms, e.g., trimethylsilyloxy, tert-butyldimethylsilyloxy)

(14) Heterocyclic oxy group (preferably a substituted or unsubstituted heterocyclic oxy group having from 2 to 30 carbon atoms, e.g., 1-phenyltetrazol-5-oxy, 2-tetrahydropyranyloxy)

(15) Acyloxy group (preferably a formyloxy group, a substituted or unsubstituted alkylcarbonyloxy group having from 2 to 30 carbon atoms or a substituted or unsubstituted arylcarbonyloxy group having from 6 to 30 carbon atoms, e.g., formyloxy, acetyloxy, pivaloyloxy, stearoyloxy, benzoyloxy, p-methoxyphenylcarbonyloxy)

(16) Carbamoyloxy group (preferably a substituted or unsubstituted carbamoyloxy group having from 1 to 30 carbon atoms, e.g., N,N-dimethylcarbamoyloxy, N,N-diethylcarbamoyloxy, morpholinocarbonyloxy, N,N-di-n-octylaminocarbonyloxy, N-n-octylcarbamoyloxy)

(17) Alkoxycarbonyloxy group (preferably a substituted or unsubstituted alkoxycarbonyloxy group having from 2 to 30 carbon atoms, e.g., methoxycarbonyloxy, ethoxycarbonyloxy, tert-butoxycarbonyloxy, n-octylcarbonyloxy)

(18) Aryloxycarbonyloxy group (preferably a substituted or unsubstituted aryloxycarbonyloxy group having from 7 to 30 carbon atoms, e.g., phenoxycarbonyloxy, p-methoxyphenoxycarbonyloxy, p-n-hexadecyloxyphenoxycarbonyloxy)

(19) Amino group (preferably an amino group, a substituted or unsubstituted alkylamino group having from 1 to 30 carbon atoms or a substituted or unsubstituted anilino group having from 6 to 30 carbon atoms, e.g., amino, methylamino, dimethylamino, anilino, N-methyl-anilino, diphenylamino)

(20) Ammonio group (preferably an ammonio group or an ammonio group substituted by a substituted or unsubstituted alkyl, aryl or heterocyclic group having from 1 to 30 carbon atoms, e.g., trimethylammonio, triethylammonio, diphenylmethylammonio)

(21) Acylamino group (preferably a formylamino group, a substituted or unsubstituted alkylcarbonylamino group having from 1 to 30 carbon atoms or a substituted or unsubstituted arylcarbonylamino group having from 6 to 30 carbon atoms, e.g., formylamino, acetylamino, pivaloylamino, lauroylamino, benzoylamino, 3,4,5-tri-n-octyloxyphenylcarbonylamino)

(22) Aminocarbonylamino group (preferably a substituted or unsubstituted aminocarbonylamino group having from 1 to 30 carbon atoms, e.g., carbamoylamino, N,N-dimethylaminocarbonylamino, N,N-diethylaminocarbonylamino, morpholinocarbonylamino)

(23) Alkoxycarbonylamino group (preferably a substituted or unsubstituted alkoxycarbonylamino group having from 2 to 30 carbon atoms, e.g., methoxycarbonylamino, ethoxycarbonylamino, tert-butoxycarbonylamino, n-octadecyloxycarbonylamino, N-methyl-methoxycarbonylamino)

(24) Aryloxycarbonylamino group (preferably a substituted or unsubstituted aryloxycarbonylamino group having from 7 to 30 carbon atoms, e.g., phenoxycarbonylamino, p-chlorophenoxycarbonylamino, m-(n-octyloxy)phenoxycarbonylamino)

(25) Sulfamoylamino group (preferably a substituted or unsubstituted sulfamoylamino group having from 0 to 30 carbon atoms, e.g., sulfamoylamino, N,N-dimethylaminosulfonylamino, N-n-octylaminosulfonylamino)

(26) Alkyl- or aryl-sulfonylamino group (preferably a substituted or unsubstituted alkylsulfonylamino group having from 1 to 30 carbon atoms or a substituted or unsubstituted arylsulfonylamino group having from 6 to 30 carbon atoms, e.g., methylsulfonylamino, butylsulfonylamino, phenylsulfonylamino, 2,3,5-trichlorophenylsulfonylamino, p-methylphenylsulfonylamino)

(27) Mercapto group (28) Alkylthio group (preferably a substituted or unsubstituted alkylthio group having from 1 to 30 carbon atoms, e.g., methylthio, ethylthio, n-hexadecylthio)

(29) Arylthio group (preferably a substituted or unsubstituted arylthio group having from 6 to 30 carbon atoms, e.g., phenylthio, p-chlorophenylthio, m-methoxyphenylthio)

(30) Heterocyclic thio group (preferably a substituted or unsubstituted heterocyclic thio group having from 2 to 30 carbon atoms, e.g., 2-benzothiazolylthio, 1-phenyltetrazol-5-ylthio)

(31) Sulfamoyl group (preferably a substituted or unsubstituted sulfamoyl group having from 0 to 30 carbon atoms, e.g., N-ethylsulfamoyl, N-(3-dodecyloxypropyl)sulfamoyl, N,N-dimethylsulfamoyl, N-acetylsulfamoyl, N-benzoylsulfamoyl, N—(N'-phenylcarbamoyl)sulfamoyl)

(32) Sulfo group (33) Alkyl- or aryl-sulfinyl group (preferably a substituted or unsubstituted alkylsulfinyl group having from 1 to 30 carbon atoms or a substituted or unsubstituted arylsulfinyl group having from 6 to 30 carbon atoms, e.g., methylsulfinyl, ethylsulfinyl, phenylsulfinyl, p-methylphenylsulfinyl)

(34) Alkyl- or aryl-sulfonyl group (preferably a substituted or unsubstituted alkylsulfonyl group having from 1 to 30 carbon atoms or a substituted or unsubstituted arylsulfonyl group having from 6 to 30 carbon atoms, e.g., methylsulfonyl, ethylsulfonyl, phenylsulfonyl, p-methylphenylsulfonyl)

(35) Acyl group (preferably a formyl group, a substituted or unsubstituted alkylcarbonyl group having from 2 to 30 carbon atoms, a substituted or unsubstituted arylcarbonyl group having from 7 to 30 carbon atoms or a substituted or unsubstituted heterocyclic carbonyl group having from 4 to 30 carbon atoms and being bonded to a carbonyl group through a carbon atom, e.g., acetyl, pivaloyl, 2-chloroacetyl, stearoyl, benzoyl, p-n-octyloxyphenylcarbonyl, 2-pyridylcarbonyl, 2-furylcarbonyl)

(36) Aryloxycarbonyl group (preferably a substituted or unsubstituted aryloxycarbonyl group having from 7 to 30 carbon atoms, e.g., phenoxycarbonyl, o-chlorophenoxycarbonyl, m-nitrophenoxycarbonyl, p-tert-butylphenoxycarbonyl)

(37) Alkoxycarbonyl group (preferably a substituted or unsubstituted alkoxycarbonyl group having from 2 to 30 carbon atoms, e.g., methoxycarbonyl, ethoxycarbonyl, tert-butoxycarbonyl, n-octadecyloxycarbonyl)

(38) Carbamoyl group (preferably a substituted or unsubstituted carbamoyl group having from 1 to 30 carbon atoms, e.g., carbamoyl, N-methylcarbamoyl, N,N-dimethylcarbamoyl, N,N-di-n-octylcarbamoyl, N-(methylsulfonyl)-carbamoyl)

(39) Aryl- or heterocyclic-azo group (preferably a substituted or unsubstituted arylazo group having from 6 to 30 carbon atoms or a substituted or unsubstituted heterocyclic-azo group having from 3 to 30 carbon atoms, e.g., phenylazo, p-chlorophenylazo, 5-ethylthio-1,3,4-thiadiazol-2-ylazo)

(40) Imido group (preferably N-succinimido, N-phthalimido)

(41) Phosphino group (preferably a substituted or unsubstituted phosphino group having from 2 to 30 carbon atoms, e.g., dimethylphosphino, diphenylphosphino, methylphenoxyphosphino)

(42) Phosphinyl group (preferably a substituted or unsubstituted phosphinyl group having from 2 to 30 carbon atoms, e.g., phosphinyl, dioctyloxyphosphinyl, diethoxyphosphinyl)

(43) Phosphinyloxy group (preferably a substituted or unsubstituted phosphinyloxy group having from 2 to 30 carbon atoms, e.g., diphenoxyphosphinyloxy, dioctyloxyphosphinyloxy)

(44) Phosphinylamino group (preferably a substituted or unsubstituted phosphinylamino group having from 2 to 30 carbon atoms, e.g., dimethoxyphosphinylamino, dimethylaminophosphinylamino)

(45) Phospho group (46) Silyl group (preferably a substituted or unsubstituted silyl group having from 3 to 30 carbon atoms, e.g., trimethylsilyl, triethylsilyl, tri(iso-propyl)silyl, tert-butyldimethylsilyl, phenyldimethylsilyl)

(47) Hydrazino group (preferably a substituted or unsubstituted hydrazino group having from 0 to 30 carbon atoms, e.g., trimethylhydrazino)

(48) Ureido group (preferably a substituted or unsubstituted ureido group having from 0 to 30 carbon atoms, e.g., N,N-dimethylureido)

The two substituents represented by W may also have a structure condensed with a ring, e.g., an aromatic or non-aromatic hydrocarbon ring, a heterocyclic ring or a polycyclic condensed ring formed by the combination of these rings, e.g., a benzene ring, a naphthalene ring, an anthracene ring, a phenanthrene ring, fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, a indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring, a phenazine ring. Among these, a benzene ring, a pyrrole ring, a furan ring, a thiophene ring, an imidazole ring, an oxazole ring, a thiazole ring, a pyridine ring, and a pyrazine ring are preferable.

Among these substituents W, those having a hydrogen atom may be deprived of the hydrogen atom and substituted by the above-described substituent. Examples of these substituents include —CONHSO$_2$— group (sulfonylcarbamoyl group, carbonylsulfamoyl group), —CONHCO— group (carbonylcarbamoyl group), and —SO$_2$NHSO$_2$— group (sulfonylsulfamoyl group).

Specific examples thereof include an alkylcarbonylaminosulfonyl group (e.g., acetylaminosulfonyl group), an arylcarbonylaminosulfonyl group (e.g., benzoylaminosulfonyl group), an alkylsulfonylaminocarbonyl group (e.g., methylsulfonylaminocarbonyl group), and an arylsulfonylaminocarbonyl group (e.g., p-methylphenylsulfonylaminocarbonyl group).

Specific examples of the p-type organic semiconductor material represented by (Pc-1), (Nc-1), or (Nc-2) are shown in the followings, but the present invention is not limited thereto. (Hereinafter, in the present specification, Bu represents a butyl group, Pr represents a propyl group, Et represents an ethyl group and Ph represents a phenyl group).

Compounds 1~15

Compounds 16~20

| Compound | M | R | n | R' | R" |
|---|---|---|---|---|---|
| 1 | Si | OSi(n-Bu)$_3$ | 2 | H | H |
| 2 | Si | OSi(i-Pr)$_3$ | 2 | H | H |
| 3 | Si | OSi(OEt)$_3$ | 2 | H | H |
| 4 | Si | OSiPh$_3$ | 2 | H | H |
| 5 | Si | O(n-C$_8$H$_{17}$) | 2 | H | H |

-continued

Compounds 1~15

Compounds 16~20

| Compound | M | R | n | R' | R" |
|---|---|---|---|---|---|
| 7 | Ge | OSi(n-Bu)$_3$ | 2 | H | H |
| 8 | Sn | OSi(n-Bu)$_3$ | 2 | H | H |
| 9 | Al | OSi(n-C$_6$H$_{13}$)$_3$ | 1 | H | H |
| 10 | Ga | OSi(n-C$_6$H$_{13}$)$_3$ | 1 | H | H |
| 11 | Cu | — | — | O(n-Bu) | H |
| 12 | Ni | — | — | O(n-Bu) | H |
| 13 | Zn | — | — | H | t-Bu |
| 14 | V | O | — | H | t-Bu |
| 15 | H$_2$ | — | — | H | t-Bu |
| 16 | Si | OSiEt$_3$ | 2 | — | — |
| 17 | Ge | OSiEt$_3$ | 2 | — | — |
| 18 | Sn | OSiEt$_3$ | 2 | — | — |
| 19 | Al | OSiEt$_3$ | 1 | — | — |
| 20 | Ga | OSiEt$_3$ | 1 | — | — |

(Element-Constituting Materials Other than the Semiconductor Active Layer)

Hereinafter, element-constituting materials other than the semiconductor active layer 14 in the transparent organic thin film transistor shown in FIG. 1 will be described. Each of these materials preferably has a visible or infrared light transmission coefficient of 60% or more, preferably 70% or more, and still more preferably 80% or more.

The transparent substrate 11 shown in FIG. 1 is not particularly limited, as long as it is transparent, colorless and smooth to a certain degree. Examples thereof include glass, quartz, light-transmitting plastic films and the like. Examples of the light-transmitting plastic films include those of polyethylene terephthalate (PET), polyethylene naphthalate (PEN), polyether sulfone (PES), polyether imide, polyether ether ketone, polyphenylene sulfide, polyarylate, polyimide, polycarbonate (PC), cellulose triacetate (TAC), cellulose acetate propionate (CAP) and the like. An organic or inorganic filler may be added to these plastic films in the range that does not impair the optical transparency.

In FIG. 1, the material for each of the transparent gate electrode 12, the transparent source electrode 15a and the transparent drain electrode 15b is not particularly limited, as long as it is transparent, colorless and also conductive to a certain degree. Examples thereof include transparent conductive oxides such as ITO (indium-doped tin oxide), IZO (indium-dope zinc oxide), SnO$_2$, ATO (antimony-doped tin oxide), ZnO, AZO (aluminum-doped zinc oxide), GZO (gallium-doped zinc oxide), TiO$_2$, and FTO (fluorine-doped tin oxide); transparent conductive polymers such as PEDOT/PSS (poly(3,4-ethylenedioxythiophene)/polystyrenesulfonic acid); and carbon materials such as carbon nanotubes. These electrode material can be film-formed by a method such as vacuum deposition, sputtering, or solution coating method. For improvement in transparency and colorlessness, the thickness of the electrode is preferably 5 to 200 nm, more preferably 5 to 100 nm, and still more preferably 5 to 50 nm.

The material for the transparent insulator layer 13 in FIG. 1 is not particularly limited, as long as it is transparent, colorless and sufficiently insulative. Examples thereof include inorganic materials such as silicon dioxide, silicon nitride, and alumina; and organic materials such as polyesters (PEN (polyethylene naphthalate), PET (polyethylene terephthalate), and the like), polycarbonates, polyimides, polyamides, polyacrylates, epoxy resins, polypara-xylylene resins, novolac resins, PVA (polyvinylalcohol), and PS (polystyrene). These materials of the transparent insulation layer can be film-formed by a method such as vacuum deposition, sputtering, or solution coating method. For improvement in transparency and colorlessness, the film thickness of the insulator layer is preferably 5 to 300 nm, more preferably 5 to 300 nm, and still more preferably 5 to 200 nm.

The gate width (channel width) W and gate length (channel length) L are not particularly limited, but the ratio of W to L is preferably 10 or more, and more preferably 20 or more.

For isolation of the element from air and water and improvement of storage life of the element, the entire element may be sealed with an inorganic material such as glass, silicon nitride or alumina or with a polymeric material such as parylene.

[Transparent Semiconductive Circuit, Image-Displaying Device, and Light-Receiving Device]

A transparent semiconductive circuit can be prepared by wiring the organic transparent TFT element according to the present invention with a transparent conductive material (e.g., electrode material described above). Such a transparent semiconductive circuit can be used preferably as a selective driving circuit driving the pixel elements in image-displaying device and light-receiving device. Because opaque silicon TFT elements have normally been used as these selective driving circuits, the drive elements and the apertural area (light-emitting area) should be formed at different positions, which lead to decrease in numerical aperture. It is possible, by using the transparent organic TFT element according to the present invention as the selective driving circuits in these image-displaying device and light-receiving device, to make lamination of the selective driving circuit with the light-emitting area and thus to give a electronic device having a higher numerical aperture. The image-displaying device is preferably, for example, an active-matrix liquid crystal display device or an organic EL display device, and the light-receiving device is preferably an optical sensor such as solid-state image sensing device.

The selective driving circuit is formed on a substrate by placing multiple scanning lines and multiple signal lines in the directions mutually perpendicular to each other and pixel units and the selective driving circuits at the intersections of these wirings. In a liquid crystal display device, at least one thin film transistor is used as the switching element transmitting the signal from a signal line (source bus line) connected to a source to the display electrode under control by a scanning line (gate bus line) connected to a gate. In an organic EL display device, at least two thin film transistors are used as a selection transistor connected to a scanning line (gate bus line) controlling on/off of the signal form a signal line and also as a drive transistor controlling electric current according to the signal from the signal line and emission of the organic EL element. A solid-state image sensing device has a circuit configuration similar to that of the organic EL display device. It is possible, by using the substantially transparent and colorless organic TFT above as the TFT and forming wirings including electrical contacts with the TFT by using a substantially transparent conductive material, to make an active-matrix selective driving circuit substantially transparent and colorless, and to remove the cause of deterioration in the numerical aperture of the selective driving circuit in each pixel in a light-receiving devices, such as active-matrix liquid crystal display device, organic EL display device, or solid-state image sensing device, carrying the driving circuit made of a semiconductive circuit for example of silicon.

Figure 2:
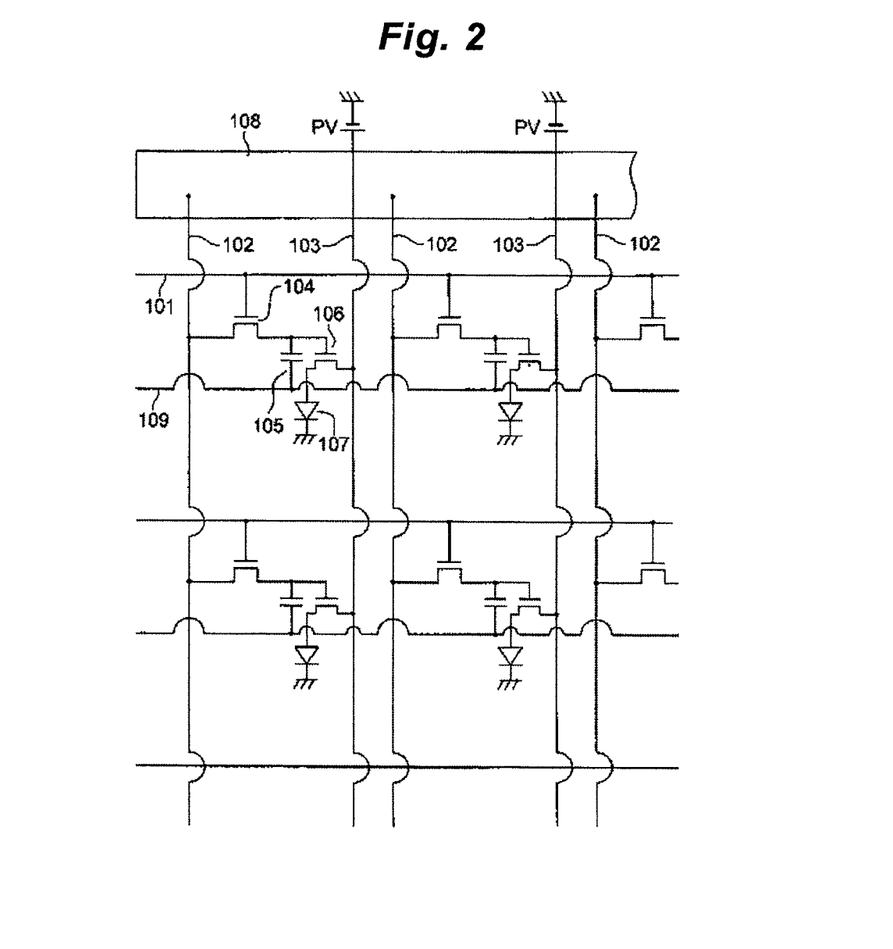
FIG. 2 is a diagram showing an equivalent circuit of an example of a selective driving circuit in an organic EL display device or a solid-state image sensing device.

FIG. 2 is a diagram showing an equivalent circuit as a preferred embodiment of the selective driving circuit in an organic EL display device. Multiple gate lines 101 extending in the line direction and multiple data lines 102 and drive lines 103 extending crosswise in the row direction are formed. Each drive line 103 is connected to a power source PV. The power source PV is a power source outputting a constant positive voltage, and the voltage is, for example, positive 10 V with ground voltage as standard. A selection TFT 104 is connected to each intersection between the gate line 101 and the data line 102. The gate of selection TFT 104 is connected to the gate line 101, while the drain of the selection TFT 104 to the data line 102. The source of the selection TFT 104 is connected to a holding condenser 105 and the gate of a drive TFT 106. The drain of the drive TFT 106 is connected to the drive line 103, and the source is connected to the positive electrode of the organic EL display element 107. The negative electrode of the organic EL display element 107 is grounded. The counter electrode of the holding condenser 105 is connected to a capacity line 109 extending in the line direction.

The gate line 101 is connected to a gate line driver not shown in the Figure, and gate signals are applied to the gate line 101 one by one by the gate line driver. The gate signal is a signal of on or off. For example, a predetermined positive voltage is applied when it is on, and the voltage is 0 V when it is off. The gate line driver turns on the gate signal on a selected predetermined gate line among the multiple gate lines 101 connected. When the gate signal is on, all selection TFTs 104 connected to the gate line 101 are turned on, and the data line 102 and the gate of the drive TFT 106 are connected to each other via the selection TFT 104. A data signal, which is determined according to the image to be displayed, is output to the data line 102 from the data line driver 108, and the data signal is input to the gate of the drive TFT 106 and the holding condenser 105 is charged. The drive TFT 106 connects the drive line 103 with the organic EL display element 107 at a conductivity corresponding to the size of the data signal. As a result, a current according to the data signals is supplied via the drive TFT 106 from the drive line 103 to the organic EL display element (photoelectric conversion element) 107, and the organic EL display element 107 emits light at a brightness according to the data signal. The holding condenser 105, which forms an electrostatic capacity with another electrode such as dedicated capacity line 109 or drive line 103, can store the data signal for a certain period of time. Even after the selection TFT 104 is turned off as the gate line driver selects another gate line 101 and the gate line 101 is unselected, the data signal is retained by the holding condenser 105 for one vertical scanning period, and the drive TFT 106 remains conductive for the period and the organic EL display element 107 keeps light emission at the same brightness.

Described above is the operational principle of the active-matrix organic EL display device, and in the present description, the circuit having the selection TFT 104, the drive TFT 106 and others described above and supplying current to a predetermined display device according to the data signal selecting one or more display devices simultaneously such as gate signal and a data signal determined by the image to be displayed is generally called a selective driving circuit. The selective driving circuit may have a pattern other than those described above, and such patterns are already proposed. For example, known is a driving circuit having four TFTs for prevention of fluctuation in luminescent brightness of each pixel, the configuration is only an example, and the present invention is not limited thereto.

Figure 3:
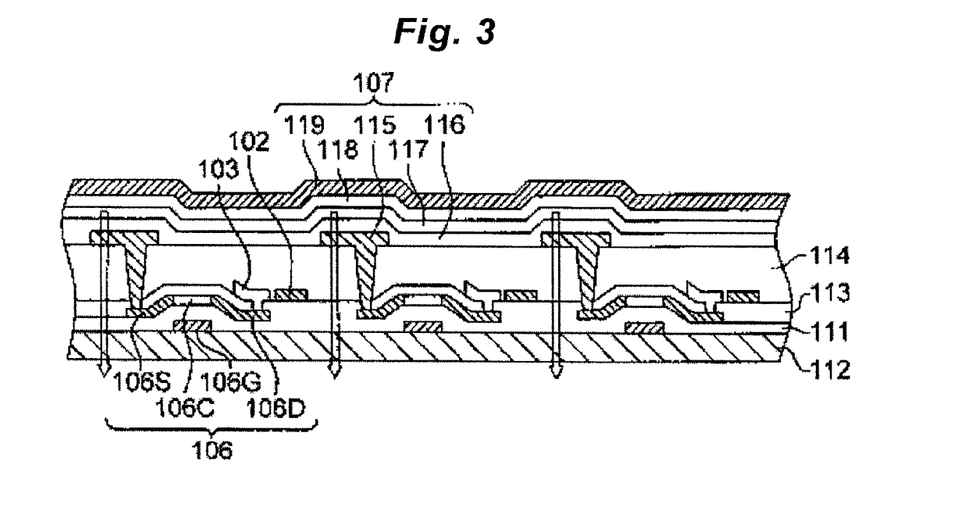
FIG. 3 is a schematic cross-sectional view illustrating an example of a configuration of an organic EL display element or a solid-state image sensing device.

FIG. 3 is a cross-sectional view illustrating a preferred embodiment of the configuration of the active-matrix organic EL display device described above. In the Figure, selections TFT 104 and connections thereof with data lines 102 and drive TFTs 106 are not shown in the Figure. The following configuration is only an example, and the present invention is not limited thereto.

Multiple drive TFTs 106 are placed on a glass substrate 112. Specifically, gate electrodes 106G of drive TFTs 106 of an ITO film are first formed to have a film thickness of 100 nm on the glass substrate 112. An interlayer insulation film 111 of $Al_2O_3$ is then formed thereon by electron beam vapor deposition (film thickness: 200 nm). An ITO film is then formed on the interlayer insulation film 111 to have a film thickness of 50 nm by low-temperature sputtering using a mask, forming source electrodes 106S and drain electrodes 106D. Subsequently, a chloroform solution of exemplary compound 1 (5 g/L) is coated between the sources and drain electrodes by spin coating, forming semiconductor active layers 106C having a thickness of 30 nm. An interlayer insulation film 113 also of $Al_2O_3$ is formed on the drive TFT 106 by electron beam vapor deposition to have a film thickness of 100 nm. Data lines 102 and drive lines 103 are also formed by patterning, after an ITO film is formed over the entire surface of the interlayer insulation film 113 by low-temperature sputtering to have a film thickness 100 nm. The drive lines 103 thus formed are connected to the drain electrodes 106D of the drives TFT 106 via contact holes. In addition, a flattening insulation film 114 of $Al_2O_3$ is formed thereon by electron beam vapor deposition to have a film thickness of 100 nm. Positive electrode 115 of ITO transparent electrodes are formed by sputtering and patterning (film thickness: 100 nm) on the flattening insulation film 114 in the following way, forming an organic EL display element 107 in each pixel. Specifically, after electron beam vapor deposition of the flattening insulation film 114 of $Al_2O_3$, holes for the contact holes extending through the flattening insulation film 114 and the interlayer insulation film 113 to the source electrodes 106S of drive TFT 106 are formed by drilling with excimer laser; an ITO film is formed simultaneously on the surface of the flattening insulation film 114 and the internal wall of the holes for contact holes; positive electrodes 115 are then formed by surface patterning; and each positive electrode 115 and each source electrode 106S of drive TFT 106 are electrically connected to each other with the ITO film.

Subsequently, α-NPD (4,4'-bis(N-(1-naphthyl)-N-phenylamino]biphenyl) is vapor-deposited as hole-transporting layer (electron-blocking layer) 116 on the positive electrodes of ITO film thus formed, to have a film thickness of 40 nm; and additionally, CBP (4,4'-(N,N'-biscarbazolyl)biphenyl) and tris(2-phenylpyridine) iridium complex are co-vapor-deposited at a volume ratio of 100:7 to have a film thickness of 20 nm, forming a light-emitting layer (photoelectric conversion layer) 117. A hole blocking layer of BCP (vasocuproin) having a film thickness of 10 nm is then formed (not shown in the figure), and an electron-transporting layer (hole-blocking layer) 118 of $Alq_3$ (tris(8-quinolinolato) aluminum (III)) having a film thickness of 40 nm is also formed similarly by vapor deposition. In addition, lithium oxide ($Li_2O$) is vapor-deposited as a negative-electrode buffer layer to a thickness of 0.5 nm (not shown in Figure). An aluminum film is formed additionally on the layer above by vacuum deposition to a thickness of 100 nm, forming a negative electrode 119 facing the positive electrodes 115.

The organic EL display device prepared in this way emits light by recombination of the holes injected from the positive electrode 115 into the hole-transporting layer 116 and the electrons injected from the negative electrode 119 into the electron-transporting layer 118 in the light-emitting layer 117, and the light is radiated outward through the glass substrate 112 from the side of the transparent positive electrode 115, as indicated by the arrow in FIG. 3. The positive electrode 115 is formed independently in each pixel, and the hole-transporting layer 116, the light-emitting layer 117, the electron-transporting layer 118, and the negative electrode 119 are formed commonly to these pixels.

The configurations and others of liquid crystal display devices are described in detail, for example, in JP-A-2002-116744 ("JP-A" means unexamined published Japanese patent application) and JP-A-2002-122844, and see these documents for reference. Various materials, configurations and others of EL display devices are described in detail, for example, in JP-A-2002-56976, JP-A-2002-141170 and JP-A-2002-100480, and see these documents for reference. Various materials, configurations and others of the light-receiving devices used, for example in a solid-state image sensing device, are described in detail, for example, in JP-A-2003-234460, JP-A-2003-332551 and JP-A-2005-268609, and see these documents for reference.

Even if less transparent and colorless wirings and elements are included locally in these circuits and devices, the advantageous effects of improving the transparency and colorlessness of transistor are significant, unless the local region is practically substantially larger.

It is possible by using the substantially transparent and colorless p-type organic semiconductor material for use in the present invention to obtain transparent organic electronic devices other than the transparent organic TFT. Such a transparent organic electronic device is not particularly limited, but is preferably a device using an electronic component in the film structure, and favorable examples thereof include organic photoelectric conversion elements, organic electroluminescent elements, gas sensors, organic rectification elements, organic inverters, and information-recording elements. The organic photoelectric conversion elements can be used both in optical sensor application (solid-state image sensing device) and energy conversion application (organic photovoltaic cell). Preferable transparent organic electronic devices other than the transparent organic TFT include transparent organic photoelectric conversion elements and transparent organic electroluminescent elements. When these transparent organic electronic devices are produced, it is preferable to use a highly transparent and colorless material for the substrate, electrode, and other elements, similarly to the embodiment of the transparent organic TFT described above.

According to the present invention, it is possible to provide a highly transparent and colorless organic thin film transistor, a transparent semiconductive circuit prepared by using the transistor, and an image-displaying device and a light-receiving device having a high numerical aperture.

The organic transparent thin film transistor according to the present invention is highly transparent and colorless. The semiconductive circuit using the organic transparent thin film transistor according to the present invention can provide an image-displaying device and a light-receiving device favorable in appearance, allowing lamination of the light-emitting layer and light-receiving layer when used as a selective driving circuit and thus having a higher numerical aperture.

The present invention will be described in more detail with the following examples. The materials, the amounts to be used, the proportions, the contents and procedures of treatment or processing, which will be shown in the examples, may be appropriately changed or modified, without departing from the spirit of the present invention. Therefore, the following examples are not interpreted as limiting of the scope of the present invention.

EXAMPLES

Exemplary compounds 1 to 4 used in the following Examples were prepared with reference to JP-A-63-5903. Exemplary compounds 7 to 10 were prepared with reference to JP-A-63-186251 and Inorg. Chem., 1992, vol. 31, p. 3371-3377. Exemplary compounds 16 to 20 were prepared with reference to J. Am. Chem. Soc., 1990, vol. 112, p. 8064-8070. Exemplary compounds 5 and 11 to 15, and comparative compounds, pentacene and vanadyl phthalocyanine (VOPc), were purchased from Aldrich.

Example 1

Absorption Spectra of Thin Films

Figure 4:
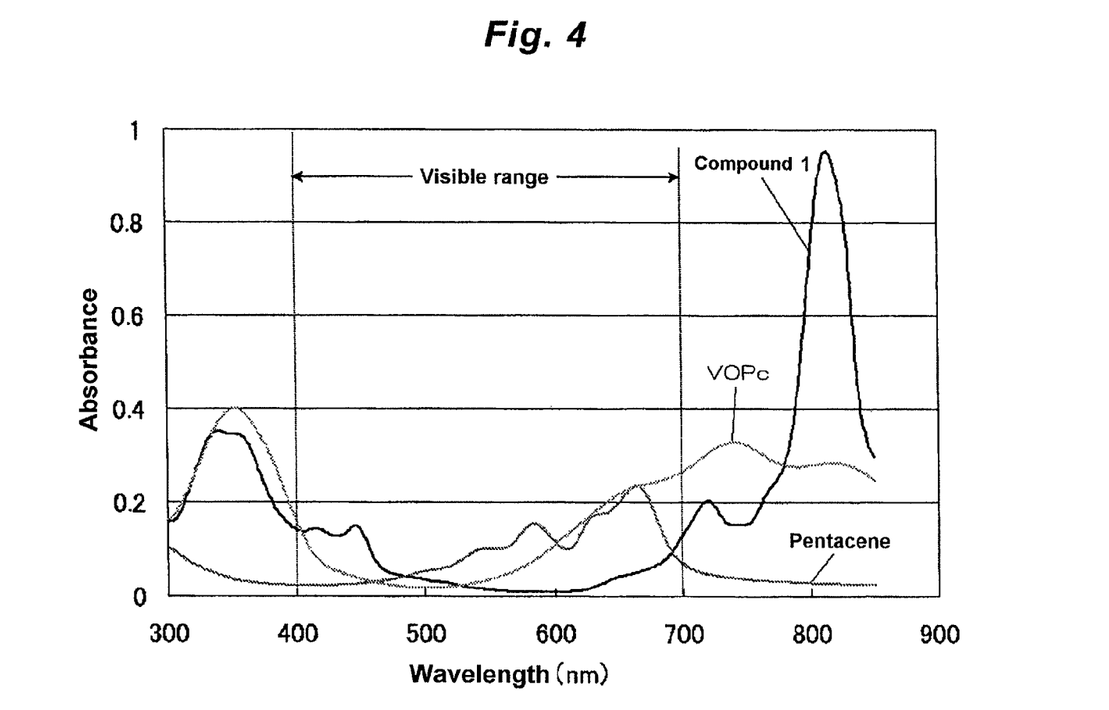
FIG. 4 is a graph showing a measurement result of absorption spectra of the thin films of an exemplified compound 1 and comparative compounds, pentacene and vanadyl phthalocyanine (VOPc) (all film thickness: 30 nm).

Each of the exemplified compounds 1 to 4 was deposited under vacuum on a quartz substrate to have a film thickness of approximately 30 nm. Separately, the comparative compounds, pentacene and VOPc, were respectively deposited under vacuum similarly to have a film thickness of approximately 30 nm. The absorption spectra of these thin films were obtained by using an ultraviolet-visible near-infrared spectrophotometer (trade name, UV-3600, manufactured by Shimadzu Corp.). Measurement results are shown in FIG. 4 and Table 1. FIG. 4 is a chart showing a measurement result of absorption spectra of the thin films of the exemplified compound 1 and comparative compounds, pentacene and vanadyl phthalocyanine (VOPc). The data in FIG. 4 and Table 1 are absorbance values per a film thickness of 30 nm obtained by conversion by using a calibration curve. The film thickness was determined by using a stylus profilometer (trade name: DEKTAK 6M, manufactured by ULVAC). Differently from pentacene and VOPc used for comparison, the exemplified compounds 1 to 4 had an absorption maximum wavelength of 800 nm or more and an maximum absorbance in the visible range of 0.2 or less, indicating that the thin films of the exemplified compounds 1 to 4 were all superior in colorlessness and transparency. In addition, the thin films of the exemplified compounds 5 to 20 were also shown to be highly transparent and colorless similarly.

TABLE 1

| Compound | Absorption Maximum Wavelength | Maximum Absorbance in the Visible Range (Wavelength) | Remarks |
|---|---|---|---|
| 1 | 816 nm | 0.15 (446 nm) | This invention |
| 2 | 818 nm | 0.11 (400 nm) | This invention |
| 3 | 825 nm | 0.17 (400 nm) | This invention |
| 4 | 818 nm | 0.14 (400 nm) | This invention |
| Pentacene | 665 nm | 0.23 (665 nm) | Comparative example |
| VOPc | 740 nm | 0.26 (700 nm) | Comparative example |

Example 2

Preparation and Evaluation of Transparent Organic TFT Elements

An $Al_2O_3$ film was formed as a transparent insulator layer on a ITO-carrying glass substrate by electron beam (EB) vapor deposition to have a film thickness of 200 nm. An ITO film was patterned thereon by low-temperature sputtering by using a mask to have a film thickness of 50 nm, forming transparent source electrodes and transparent drain electrodes. A chloroform solution of each exemplified compound 1 to 4 (5 g/L) was spin-coated thereon, forming a semiconductor active layer having a thickness of 30 nm and giving a bottom-contact type organic TFT element. The element prepared was superior in transparency and colorlessness.

Figure 5:
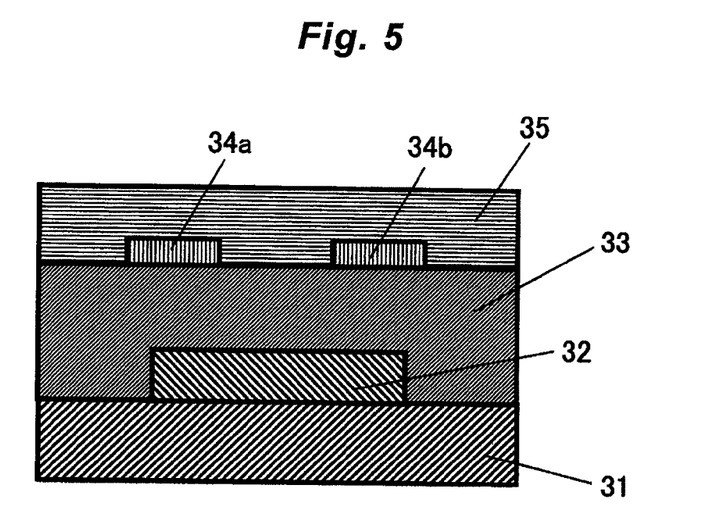
FIG. 5 is a schematic cross-sectional view illustrating a configuration of the transparent organic thin film transistor element prepared in Example 2.

FIG. 5 is a schematic sectional view illustrating the element thus prepared. As shown in FIG. 5, the organic TFT element prepared had a transparent substrate (glass) 31 as the undermost layer, a transparent electrode (ITO) 32 formed thereon, and a transparent insulator layer ($Al_2O_3$) 33 over the transparent electrode 32 thereon and in the region other than the transparent electrode 32 in contact with the transparent substrate 31. In addition, a transparent source electrode (ITO) 34a and a transparent drain electrode (ITO) 34b were formed separately in different regions on the top surface of the transparent insulator layer 33. Further, a semiconductor active layer (p-type organic semiconductor material) 35 was formed additionally, as it covered the electrodes 34a and 34b and was in contact with the transparent insulator layer 33 in the region other than the electrodes 34a and 34b.

Figure 6:
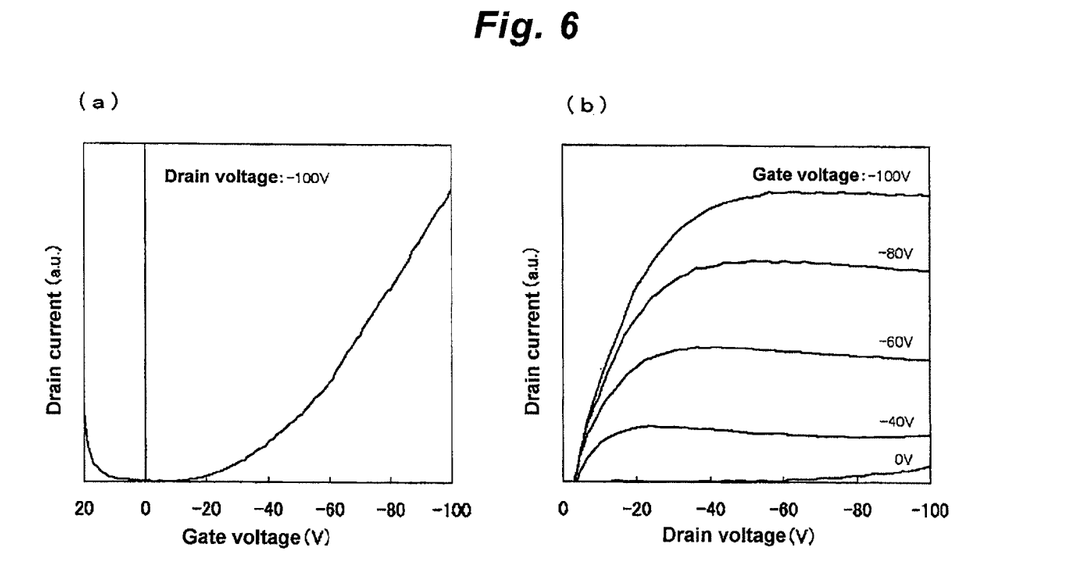
FIG. 6 are graphs showing transistor characteristics of a transparent organic thin film transistor according to the present invention that is prepared by using the exemplified compound 1 ((a): gate voltage-drain current characteristics, when a drain voltage of −100 V was applied, and (b): drain voltage-drain current characteristics).

The transistor characteristics of the element thus prepared were determined by using a semiconductor parameter analyzer (trade name: 4156C, manufactured by Agilent) connected to a semi-auto prober (trade name: AX-2000, manufactured by Vector Semiconductor) under normal pressure and nitrogen atmosphere (in glove box). Results are summarized in FIG. 6. FIG. 6(a) is a graph showing the gate voltage-drain current characteristics when a drain voltage of −100 V was applied. FIG. 6(b) is a graph showing the drain voltage-drain current characteristics at different gate voltages.

As obvious from FIG. 6, the element prepared exhibited favorable p-type transistor characteristics. The carrier mobility μ, as calculated from the drain current $I_D$, which is shown by the following equation:

$$I_D = (W/2L)\mu C_i (V_G - V_{th})^2$$

(wherein, L is the gate length; W is the gate width; $C_i$ is the volume per unit area of the insulator layer; $V_G$ is the gate voltage; and $V_{th}$ is a threshold voltage), was $2.6 \times 10^{-5}$ cm$^2$/Vs, while the on/off ratio, as obtained from the gate voltage-drain current characteristics when the element was operated at a drain voltage of −100 V and a gate voltage of −100 V, was $1.3 \times 10^4$. The transistor characteristics using the exemplified compounds 2 to 4 similarly prepared are summarized in Table 2. The elements using the exemplified compound 1 to 4 were all found to be superior in transparency and colorlessness and exhibited favorable p-type transistor characteristics. Similarly, the elements using the exemplified compounds 5 to 20 were also superior in transparency and colorlessness and showed favorable p-type transistor characteristics.

TABLE 2

| Compound | Characteristics | Carrier Mobility |
|---|---|---|
| 1 | p-type | $2.6 \times 10^{-5}$ |
| 2 | p-type | $1.5 \times 10^{-5}$ |
| 3 | p-type | $2.2 \times 10^{-5}$ |
| 4 | p-type | $1.1 \times 10^{-5}$ |

Example 3

Image-Displaying Device Using Transparent Organic TFT

A selective driving circuit of the organic EL display device shown in FIG. 2 was prepared, and an organic EL display device shown in FIG. 3 was prepared.

Multiple drive TFTs 106 were placed on a glass substrate 112. Specifically, gate electrodes 106G of drive TFTs 106 of an ITO film were first formed to have a film thickness of 100 nm on the glass substrate 112. An interlayer insulation film 111 of $Al_2O_3$ was then formed thereon by electron beam vapor deposition (film thickness: 200 nm). An ITO film was then formed on the interlayer insulation film 111 to have a film thickness of 50 nm by low-temperature sputtering using a mask, forming source electrodes 106S and drain electrodes 106D. Subsequently, a chloroform solution of the exemplified compound 1 (5 g/L) was coated between the sources and drain electrodes by spin coating, forming semiconductor active layers 106C having a thickness of 30 nm. An interlayer insulation film 113 also of $Al_2O_3$ was formed on the drive TFT 106 by electron beam vapor deposition to have a film thickness of 100 nm, and data lines 102 and drive lines 103 were also formed by patterning, after an ITO film was formed over the entire surface thereof by low-temperature sputtering to have a film thickness 100 nm. The drive lines 103 thus formed were connected to the drain electrodes 106D of the drives TFT 106 via contact holes. In addition, a flattening insulation film 114 of $Al_2O_3$ was formed thereon by electron beam vapor deposition to have a film thickness of 100 nm. Positive electrode 115 of ITO transparent electrodes were formed by sputtering and patterning (film thickness: 100 nm) on the flattening insulation film 114 in the following way, forming an organic EL display element 107 in each pixel. Specifically, after electron beam vapor deposition of the flattening insulation film 114 of $Al_2O_3$, holes for the contact holes extending through the flattening insulation film 114 and the interlayer insulation film 113 to the source electrodes 106S of drive TFT 106 were formed by drilling with excimer laser; an ITO film was formed simultaneously on the surface of the flattening insulation film 114 and the internal wall of the holes for contact holes; positive electrodes 115 were then formed by surface patterning; and each positive electrode 115 and each source electrode 106S of drive TFT 106 were electrically connected to each other with the ITO film.

Subsequently, α-NPD (4,4'-bis(N-(1-naphthyl)-N-phenylamino]biphenyl) was vapor-deposited as hole-transporting layer 116 on the positive electrodes of ITO film thus formed, to have a film thickness of 40 nm; and additionally, CBP (4,4'-(N,N'-biscarbazolyl)biphenyl) and tris(2-phenylpyridine) iridium complex were co-vapor-deposited at a volume ratio of 100:7 to have a film thickness of 20 nm, forming a light-emitting layer 117. A hole blocking layer of BCP (vasocuproin) having a film thickness of 10 nm was then formed (not shown in the figure), and an electron-transporting layer 118 of $Alq_3$ (tris(8-quinolinolato) aluminum (III)) having a film thickness of 40 nm was also formed similarly by vapor deposition. In addition, lithium oxide ($Li_2O$) was vapor-deposited as a negative-electrode buffer layer to a thickness of 0.5 nm (not shown in Figure). An aluminum film was formed additionally on the layer above by vacuum deposition to a thickness of 100 nm, forming a negative electrode 119 facing the positive electrodes 115.

The organic EL display device prepared in this way emitted light by recombination of the holes injected from the positive electrode 115 into the hole-transporting layer 116 and the electrons injected from the negative electrode 119 into the electron-transporting layer 118 in the light-emitting layer 117, and the light was radiated outward through the glass substrate 112 from the side of the transparent positive electrode 115, as indicated by the arrow in FIG. 3. The positive electrode 115 was formed independently in each pixel, and the hole-transporting layer 116, the light-emitting layer 117, the electron-transporting layer 118, and the negative electrode 119 were formed commonly to these pixels.

The organic EL display device, in which TFTs and driving circuits carrying wirings of a conductive material having electrical contacts therewith were formed with a substantially transparent material, does not demand space for incorporation of the driving circuit in the regions of the pixels and thus allows expansion of the light-emitting area, giving a brighter display. On the other hand, when a silicon-based TFT, which is not normally transparent, is used, the numerical aperture declines by the area of the driving circuit, because the driving circuit is located to the electroluminescent observation side.

Example 4

Solid-State Image Sensing Device Using Transparent Organic TFT

A selective driving circuit shown in FIG. 2 was prepared in a manner similar to Example 3, except that the organic EL display element was changed to a photoelectric conversion element. The region of the photoelectric conversion element was prepared by forming a α-NPD film as an electron-blocking layer 116 on a positive electrode of ITO film to have a film thickness of 100 nm by vapor deposition, and a photoelectric conversion layer 117 was prepared by forming a quinacridone film to have a film thickness of 100 nm by vapor deposition. A hole blocking layer 118 of $Alq_3$ having a film thickness of 50 nm was then formed similarly by vapor deposition. An aluminum film having a thickness of 100 nm was formed thereon by vacuum deposition, forming a negative electrode 119 facing the positive electrodes 115.

The solid-state image sensing device thus prepared generates holes and electrons by the charge separation in the photoelectric conversion layer 117 caused by incident light traveling inward from the side of the transparent positive electrode 115 through the glass substrate 112 in the direction opposite to that indicated by the arrow in FIG. 3, and the holes are conveyed through electron blocking layer 116 to the positive electrode 115, while the electrons through the hole blocking layer 118 to the negative electrode 119 and then withdrawn as an electrical signal. The positive electrode 115 is formed independently in each pixel, and the electron blocking layer 116, the photoelectric conversion layer 117, the hole blocking layer 118, and the negative electrode 119 are formed commonly to these pixels.

The solid-state image sensing device, in which TFTs and the driving circuits carrying wirings of a conductive material having electrical contacts therewith were formed with a substantially transparent material, does not demand space for incorporation of the driving circuit in the regions of the pixels and thus allows expansion of the light-emitting area, giving a brighter display. On the other hand, when a silicon-based TFT, which is not normally transparent, is used, the numerical aperture declines by the area of the driving circuit, because the driving circuit is located to the electroluminescent observation side.

As described above, the present invention provides a transparent organic TFT element that is superior in transparency and colorlessness and exhibits favorable transistor characteristics. It is possible to produce an image-displaying device and a light-receiving device having a high numerical aperture that contains a selective driving circuit driving pixels, which is prepared by means of laminating a selective driving circuit obtained by using the transparent organic TFT element according to the present invention on an image display device or a light-receiving device.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2008-055434 filed in Japan on Mar. 5, 2008, which is entirely herein incorporated by reference.

What is claimed is:

1. A transparent organic thin film transistor, which comprises a p-type organic semiconductor material employed in a semiconductor active layer of the organic transparent thin film transistor,
   wherein the p-type organic semiconductor material has a maximum absorbance of 0.2 or less in a visible range of 400 to 700 nm, in which the maximum absorbance is determined in the case where the thin film is made to have a film thickness of 30 nm.

2. The transparent organic thin film transistor according to claim 1, wherein carrier mobility thereof is $1.0 \times 10^{-5}$ cm$^2$/Vs or more.

3. The transparent organic thin film transistor according to claim 1, wherein the p-type organic semiconductor material is a low molecular compound.

4. The transparent organic thin film transistor according to claim 1, wherein the semiconductor active layer is formed by a solution coating method.

5. The transparent organic thin film transistor according to claim 1, wherein absorption maximum wavelength of the p-type organic semiconductor material in the thin film state is 700 nm or more.

6. The transparent organic thin film transistor according to claim 1, wherein the p-type organic semiconductor material is a phthalocyanine compound represented by Formula (Pc-1):

Formula (Pc-1)

wherein, M represents a central metal atom; $R^1$ to $R^{16}$ each independently represents a hydrogen atom or a substituent; R represents a substituent; and n represents 1 or 2.

7. The transparent organic thin film transistor according to claim 1, wherein the p-type organic semiconductor material is a naphthalocyanine compound represented by Formula (Nc-1):

Formula (Nc-1)

wherein, M represents a metal atom, or hydrogen atoms bound to the $N^1$ and $N^2$; $N^1$ and $N^2$ each independently represent a nitrogen atom; and $R^{17}$ to $R^{40}$ each independently represents a hydrogen atom or a substituent.

8. The transparent organic thin film transistor according to claim 1, wherein the p-type organic semiconductor material is a naphthalocyanine compound represented by Formula (Nc-2):

Formula (Nc-2)

wherein, M represents a central metal atom; $R^{17}$ to $R^{40}$ each independently represents a hydrogen atom or a substituent; R represents a substituent; and n represents 1 or 2.

9. The transparent organic thin film transistor according to claim 6, wherein, in formula (Pc-1), M is Si, Ge, Sn or Al; R to $R^{16}$ each are a hydrogen atom; and R is a triethylsilyloxy group.

10. The transparent organic thin film transistor according to claim 7, wherein, in formula (Nc-1), M is Cu, Ni, Zn, V or hydrogen atoms ($H_2$); all of $R^7$, $R^{22}$, $R^{23}$, $R^{28}$, $R^{29}$, $R^{34}$, $R^{35}$ and $R^{40}$ are a hydrogen atom or n-butyloxy group; all of $R^{20}$, $R^{26}$, $R^{32}$ and $R^{38}$ are a t-butyl group or a hydrogen atom, and $R^{18}$, $R^{19}$, $R^{21}$, $R^{24}$, $R^{25}$, $R^{27}$, $R^{30}$, $R^{31}$, $R^{33}$, $R^{36}$, $R^{37}$ and $R^{39}$ each are a hydrogen atom.

11. The transparent organic thin film transistor according to claim 8, wherein, in formula (Nc-2), M is Si, Ge, Sn or Al; $R^{17}$ to $R^{40}$ each are a hydrogen atom; and R is an alkoxy silyl group, a trialkylsilyloxy group, a trialkoxysilyloxy group or a triarylsilyloxy group.

12. A transparent semiconductor circuit, comprising the transparent organic thin film transistor according to claim 1.

13. An image-displaying device, which is driven by a selective driving circuit comprising the transparent organic thin film transistor according to claim 1.

14. A light receiving device, which is driven by a selective driving circuit comprising the transparent organic thin film transistor according to claim 1.

* * * * *